United States Patent [19]

Hirscher et al.

[11] Patent Number: 4,903,754
[45] Date of Patent: Feb. 27, 1990

[54] METHOD AND APPARATUS FOR THE TRANSMISSION HEAT TO OR FROM PLATE LIKE OBJECT

[75] Inventors: Hans Hirscher, Bad Ragaz; Rudolf Wagner, Fontnas, both of Switzerland

[73] Assignee: Balzers Aktiengesellschaft, Fürstentum, Liechtenstein

[21] Appl. No.: 262,816

[22] Filed: Oct. 26, 1988

[30] Foreign Application Priority Data

Dec. 3, 1987 [CH] Switzerland .................... 04747/87

[51] Int. Cl.⁴ .................... F28F 7/00; F28F 13/00
[52] U.S. Cl. .................... 165/1; 29/25.01; 118/728; 165/32; 165/80.1; 269/21
[58] Field of Search .................... 165/1, 32, 80.1, 80.2, 165/80.4, 96; 29/569.1; 118/724, 728, 69; 269/21

[56] References Cited

U.S. PATENT DOCUMENTS

| | | | |
|---|---|---|---|
| 4,139,051 | 2/1979 | Jones et al. | 165/1 |
| 4,537,244 | 8/1985 | Holden | 165/1 |
| 4,567,938 | 2/1986 | Turner | 165/1 |
| 4,693,211 | 9/1987 | Ogami et al. | 118/725 |

*Primary Examiner*—Martin P. Schwadron
*Assistant Examiner*—Allen J. Flanigan
*Attorney, Agent, or Firm*—Notaro & Michalos

[57] ABSTRACT

An installation for the transmission of heat energy between a carrier and a small plate receives a gas between the small plate and the carrier in order to improve the transmission of heat. The same gas serves to press the small plate against the carrier by means of a removable cover. When, for example, in a vacuum process, plate-like objects, such as semiconductors are to be processed, they are frequently heated up to elevated temperatures. Here it is suitable to provide the heat energy in a controlled homogeneous way. In other cases the small plates have to be cooled down in a controlled and steady way. The invention provides an apparatus for both processes.

15 Claims, 2 Drawing Sheets

METHOD AND APPARATUS FOR THE TRANSMISSION HEAT TO OR FROM PLATE LIKE OBJECT

FIELD AND BACKGROUND OF THE INVENTION

The present invention relates, in general, to the controlled heating or cooling of small plate-like objects, particularly those made with semiconductor materials and, in particular to a new and useful method and apparatus for heating or cooling small plate-like objects which utilizes a differential pressure between upper and lower surfaces of the object to retain the object against a heated or cooled carrier member.

The state of the art includes attempts to improve heat transmission, by radiation, convection and conduction. A convex curved clamping plate, to which a semiconductor plate is attached, is disclosed in U.S. Pat. No. 4,282,924. The cooling or heating performance of this installation is limited by its dimensions. Only the rear side of a small plate of this installation, is in contact with the heat conducting surface. On a microscopic level, only small areas of the surface in question (in a typical case less than 5%) are really in contact with each other.

Using gas pipe techniques (in German "Gasleitung") it is known, that heat coupling between two adjacent surfaces is possible. In U.S. Pat. No. 4,457,359 (equivalent to German patent application No. 33 17 967) the advantages of heat transmission by way of a gas pipe, have been combined with the advantages of solid bodies. For this purpose a convex back plate is used and the semiconductor plate is prestressed with a stretching device at the edge of this back plate, so that a high gas pressure can be used without curving the semiconductor plate.

This measure permits the smallest possible distance between the small plate and the back plate, in spite of the optimal gas pressure used, by reason of the anterior curvature in the plate. The disadvantage of this, however, lies in the fact that such a curvature of the small plate cannot be accepted, for example, in a silicon wafer with a diameter of less than 4", since this causes a risk of breakage, stress conditions in the layer and tolerance problems in the micro structure of the finished products.

SUMMARY OF THE INVENTION

It is an object of the present invention, to make full use of the advantages of heat transmission through the gas pipe for transmitting heat between a back plate and a small plate, and to avoid, at the same time, the disadvantages of a mechanical load caused by pre-curving and pre-stressing the small plate.

Accordingly, another object of the present invention is to provide an apparatus and method for transmitting heat to or from a plate-like object, comprising carrier means such as a back plate, having a surface for receiving the plate-like object or small plate, and adapted to be at a temperature which is different from that of the object or small plate so as to heat or cool the object, a gap existing between the surface of the carrier means and the object, a gas source for providing and a gas under pressure, first gas passage means connected to the gas source and operatively connected to the carrier means for either supplying gas to or removing gas from the gap between the object and the carrier means, a cover mounted for movement over the object to define a space between the object and the cover, positioning means engageable by the cover for maintaining the space and for positioning the cover with respect to the object, drive means for moving the cover into an over engagement with the positioning means to cover and uncover the object, second gas passage means connected to the gas source for supplying gas to the space between the cover and the object and pressure adjustment means connected to the gas source and to the first and second gas passage means for establishing a selected pressure difference of gas in the space and in the gap, a higher gas pressure existing in the space for pressing the object onto the surface of the carrier means.

Thus, in the invention, a gas is used as a so called gas-cushion for improving the heat transmission between the small plate and back plate as well as for pressing the small plate against this back plate, preventing at the same time the small plate from being exposed to a mechanical load. Since, in the course of this operation, the slit or gap between the small plate and the back plate remains small, heat resistance is reduced and thus, heat transmission is improved.

A still further object of the present invention is to provide an apparatus for transmitting heat to or from a plate-like object such as a small plate, which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
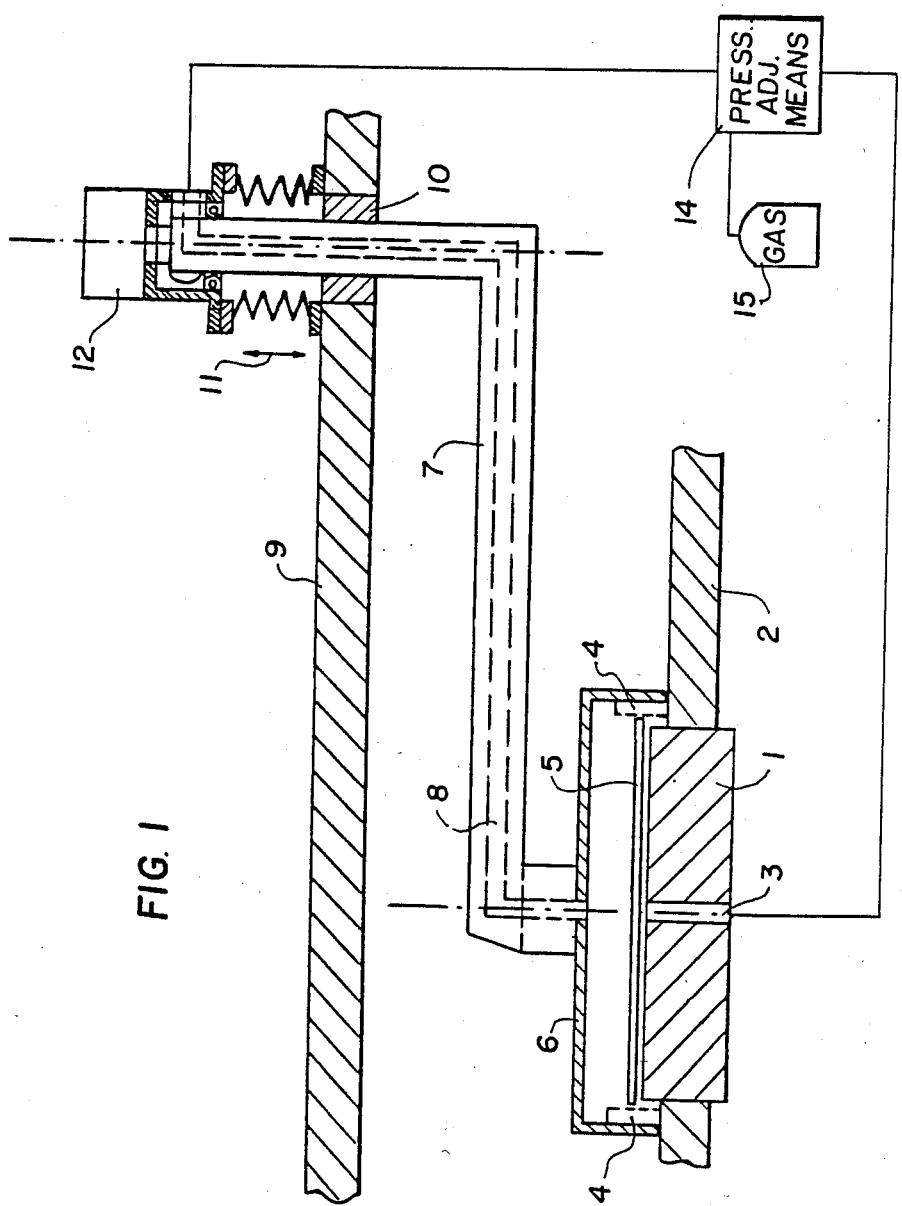
FIG. 1 is a cross-sectional view through an installation pursuant to the invention.

In the embodiment pursuant to FIG. 1, carrier means such as a back plate 1, is anchored into a base plate 2. The back plate 1 is at a different temperature from the temperature of a small plate-like object 5, which is for example, a silicon wafer. Plate 1 can thus act as a heating or a cooling plate, pursuant to an object to be obtained by the installation. Object or small plate 5 lies on back plate 1. In the case of a silicon wafer, only small areas of the two contacting surfaces (in a typical case less than 5%) are really in contact with each other, by reason of the granulation of the two working materials. An interspace or gap is thus formed between plates 1 and 5, into which a gas can be introduced through a bore 3. In the course of this operation, at least partly a molecular current of the gas is caused to flow in this interspace, if a corresponding gas pressure is present. This means that the free path of gas particles is big in relation to the geometry of the environment and thus the gas particles collide preferably at the surface of the smallplate 5 and the back plate 1, but not with other gas particles. The surface of plate 1 that receives plate 5 with a gap, is advantageously planar and metallic.

Preferably the small plate 5 is brought into a predetermined position by means of centering pins 4 that extend from plate 2. Plate 2 with or without pins 4 acts as positioning means for cover 6, and insure that a space remains between object or plate 5 and cover 6. The cover 6 is pressed mechanically onto the base plate 2 and seals the small plate 5 and the back plate 1 off against the environment, which provides, in a typical case, a gas pressure of $10^{-3}$ through $10^{-4}$ mbar In many cases it will be sufficient, if a so-called diffusion slot is formed between cover 6 and base plate 2. Cover 6 can be shifted in the vertical direction on a rotating arm 7. Rotating arm 7 is anchored at a second base plate 9 by means of a lead-through or bushing 10 and is connected to an integrated drive means or rotating-lifting elements 11, 12. By activating the lifting element 11, the cover can be shifted in the vertical direction and specifically can be lifted off the base plate 2. By rotating the rotating element 12 around its longitudinal axis, arm 7 can be shifted in the horizontal direction, and can specifically be driven over the small plate 5. Rotating element 12 may, for example, be a stepping motor and element 11 may be a bellows with a linear driver e.g. a piston and cylinder combination.

The arm and rotating-lifting elements that provide an axis of rotation for the cover 6, as well as the cover itself, have bores or channels 8 for the introduction of gas. Plate 1 also has bore 3 communicating with its upper surface for the introduction or removal of gas.

Figure 2:
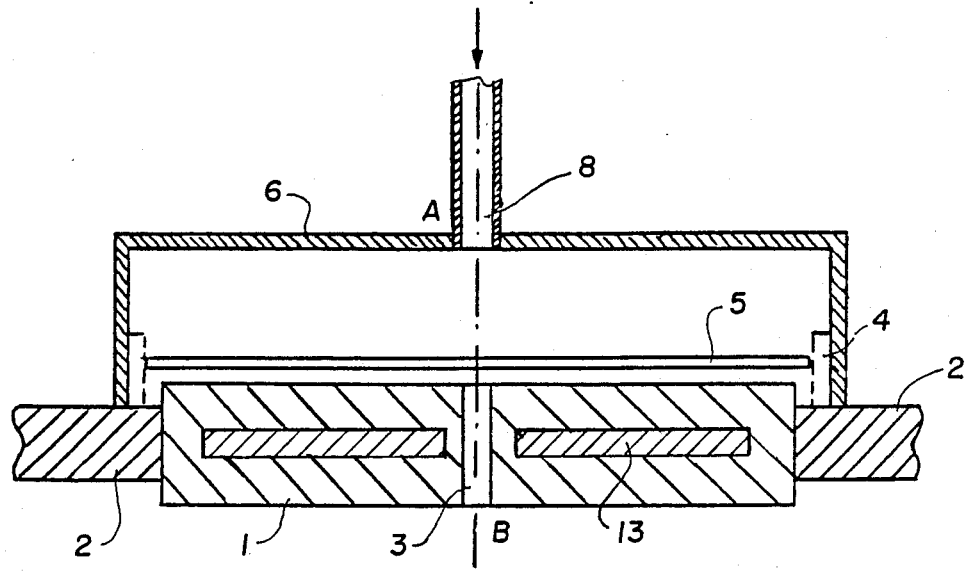
FIG. 2 is a cross-sectional view through an enlarged detail of the installation pursuant to the invention.

FIG. 2 shows the closed environment of the small plate 5 and the back plate 1, between which heat transmission takes place. Using a known dosage device (not shown) gas is introduced simultaneously at points A and B. The pressure conditions in cover 6 are controlled in such a way, that the pressure between the cover 6 and the small plate 5 is a multiple of the pressure between the back plate 1 and the small plate 5. In addition, the conductance of gas or the size of gas feed pipes to the front or top side of the small plate 5, and into the space between the back or bottom side of the small plate 5 and the back plate 1, have to be determined in such a way that a higher pressure acts on the front side of the small plate, preferably 50 mbar, than on the back side thereof which forms the "gas cushion" of preferably 15 mbar between back plate 1 and small plate 5. By this measure, the small plate is brought in an optimal way into contact with the back plate 1, without exposing the small plate 5 to a mechanical load. It has to be taken into account that the back surface of standard non-polished silicon wafers have craters of a diameter of about 10 micrometers and of a depth of about 5 micrometers. These craters cannot be brought into direct contact with the back plate 1, even if greater pressure is used on top of small plate 5.

In a variant of the method, a corresponding pressure condition can be achieved by introducing the gas only at A. Thus the gas will enter into the interspace under plate 5 and onto back plate 1, over the edges of the small plate, and will leave the installation at B.

If the back plate 1 is used as a heating plate, it might be preferable, to bring the temperature at its center to a higher level than at its periphery, so that a temperature gradient is formed in the heating plate 1. This can be obtained for example by winding heating wires, shown schematically at 13, with different densities or by providing two separately adjustable heating-wire systems in the plate.

Cooling means are also schematically shown as 13, if the plate 1 is to be used for cooling plate 5.

In general, the installation of the invention is used as follows:

The small plate 5 is placed on the back plate 1 by means of the centering pins 4. The cover 6 is moved over plate 5 and base plate 2 by means 11, 12. Gas is then introduced or lead off through the bores 3 and 8, so that the differential pressure condition between the top and bottom of plate 5 (preferably 3:1 to 10:1) is obtained. The small plate 5 is left for a preset period of time, for example some seconds, on the back plate 1, until it adopted the desired temperature as dictated by the heat transfer means 13, for example.

After this, the cover 6 is removed again and thus an equalization of pressure with the environment is achieved. In a typical case the environment between pates 2 and 9 would be $10^{-3}$ through $10^{-5}$ mbar. Finally, the small plate 5, now being at the desired temperature, can be lead to further treatment.

To establish the pressure differential between the space above object or small plate 5, and the gap between plate 5 and plate 1, pressure adjustment means schematically shown at 14 in FIG. 1 are provided, which may be connected between a gas source 15 and the gas passages in the form of bores or channels 3 and 8.

EXAMPLE

In a typical experimental arrangement, a silicon wafer was heated in time intervals of 10 to 15 seconds, to 500° C. for the production of microprocessors. The pressure between cover 6 and small plate 5 was 15 mbar. The device was operated in an installation for cathodic evaporation with an environmental pressure of $10^{-3}$ mbar and the processing used was argon, providing the normal composition.

While a specific embodiment of the invention has been showed and described in detail to illustrate the application of the principles of the invention, it will be understood that the invention may be embodied otherwise without departing from such principles.

What is claimed is:

1. An apparatus for transmitting heat to or from a plate-like object comprising:
    carrier means having a surface for receiving the object with a gap between the object and the surface, said carrier means being adapted to be at a different initial temperature from that of the object for one of heating and cooling the object;
    a gas source providing pressurized gas;
    first gas passage means connected to the gas source for one of supplying gas to and removing gas from the gap between the object and the surface of said carrier means;
    a cover mounted for movement relative to said carrier means for covering and uncovering the object on said carrier means;
    positioning means engageable by said cover for positioning said cover with respect to said carrier means to define a space between the object and said cover;
    drive means connected to said cover for moving said cover to engage said positioning means for covering and uncovering the object;
    second gas passage means connected to said gas source for supplying gas to the space between the object and said cover when said cover is engaged with said positioning means; and pressure adjustment means operatively connected to said gas source and to said first and second gas passage means for establishing a pressure differential between gas in the space and gas in the gap, gas pressure in the space being greater than gas pressure in the gap for pressing the object onto the surface of the carrier means.

2. An apparatus according to claim 1 wherein the surface of said carrier means is planar and metallic.

3. An apparatus according to claim 1 wherein said second gas passage means includes a bore through said cover communicating with the space between the object and said cover.

4. An apparatus according to claim 1 wherein said carrier means comprises a back plate having said surface for receiving the object, said first gas passage means including a bore through said back plate communicating with the gap between the object and the surface of said back plate.

5. An apparatus according to claim 1 wherein said pressure adjustment means provides gas from said gas source to said second gas passage means for supplying gas under pressure to the space between the object and said cover, said pressure adjustment means permitting gas to leave the gap through said first gas passage means at a controlled rate for establishing the pressure differential between gas in the space and in the gap.

6. An apparatus according to claim 1 including heating means operatively connected to said carrier means for heating the surface to heat the object received on the surface.

7. An apparatus according to claim 1 including cooling means operatively connected to said carrier means for cooling the surface to cool the object retained on the surface.

8. An apparatus according to claim 1 wherein said positioning-means comprises a base plate for engagement by said cover, said carrier means comprising a back plate connected to said base plate and positioned to be covered by said cover, the surface of said carrier means being defined by a metallic planar surface of said back plate which can be covered by said cover when said cover is engaged with said base plate.

9. An apparatus according to claim 8 wherein said positioning means includes a plurality of centering pins extending from said base plate around said back plate for positioning the object on said back plate and for positioning said cover on said base plate.

10. An apparatus according to claim 8 wherein said drive means includes a support plate, an arm mounted for rotation and for linear movement to said support plate, and a rotating-lifting element connected to said arm for lifting and rotating said arm, said cover being fixed to said arm.

11. An apparatus according to claim 10 wherein said second gas passage means includes a channel through said arm communicating with an interior of said cover.

12. A method of transmitting heat to or from a plate-like object comprising:
placing the object on the surface of a carrier;
covering the object with a cover;
mechanically pressing the cover against a base plate which is connected to the carrier for closing a space between the object and the cover;
introducing a gas into the space between the object and the cover;
moving gas through a gap between the carrier and the object;
adjusting the pressure of the gas in the space and in the gap so that the pressure of gas in the space exceeds the pressure of gas in the gap so as to press the object onto the surface of the carrier;
controlling the temperature of the carrier for a selected change in temperature of the object;
maintaining the object in position on the carrier for a selected period of time to permit a change in temperature of the object; and
removing the cover from base plate to equalize pressure between the interior of the cover and the exterior thereof for exposing the object for further processing.

13. A method according to claim 12 wherein the pressure of the gas in the space is from 3 to 10 times the pressure of the gas in the gap.

14. A method according to claim 12 wherein the pressure of the gas in the space is from 15 to 50 mbar higher than the pressure of gas in the gap and the selected time period is from 10 to 20 seconds.

15. A method according to claim 12 including drawing gas from the gap at a controlled rate to maintain the pressure difference between the pressure of gas in the space and the pressure of gas in the gap.

* * * * *